United States Patent
Goldfarb et al.

(10) Patent No.: US 8,652,762 B2
(45) Date of Patent: *Feb. 18, 2014

(54) ORGANIC GRADED SPIN ON BARC COMPOSITIONS FOR HIGH NA LITHOGRAPHY

(75) Inventors: Dario L. Goldfarb, Mohegan Lake, NY (US); Libor Vyklicky, Yorktown Heights, NY (US); Sean D. Burns, Hopewell Junction, NY (US); David R. Medeiros, Yorktown Heights, NY (US); Daniel P. Sanders, San Jose, CA (US); Robert D. Allen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/423,838

(22) Filed: Mar. 19, 2012

(65) Prior Publication Data

US 2012/0205787 A1   Aug. 16, 2012

Related U.S. Application Data

(62) Division of application No. 12/018,541, filed on Jan. 23, 2008, now Pat. No. 8,137,874.

(51) Int. Cl.
  *H01L 21/312* (2006.01)
  *H01L 29/02* (2006.01)
  *G03F 7/38* (2006.01)

(52) U.S. Cl.
  USPC ............ 430/311; 430/271.1; 430/275.1; 430/272.1; 430/330; 430/325; 438/952

(58) Field of Classification Search
  None
  See application file for complete search history.

(56) References Cited

U.S. PATENT DOCUMENTS

| | | | |
|---|---|---|---|
| 5,733,712 A | 3/1998 | Tanaka et al. | |
| 7,588,879 B2 | 9/2009 | Brodsky et al. | |
| 7,816,069 B2 | 10/2010 | Brodsky et al. | |
| 8,137,874 B2 * | 3/2012 | Goldfarb et al. | 430/14 |
| 2003/0008230 A1 * | 1/2003 | Li et al. | 430/270.1 |
| 2006/0074172 A1 | 4/2006 | Yang et al. | |
| 2006/0183348 A1 | 8/2006 | Meagley et al. | |
| 2006/0275696 A1 | 12/2006 | Zampini et al. | |
| 2007/0275330 A1 | 11/2007 | Bailey et al. | |
| 2008/0008955 A1 | 1/2008 | Brodsky et al. | |

* cited by examiner

*Primary Examiner* — Cynthia Hamilton
(74) *Attorney, Agent, or Firm* — Novak Druce Connolly Bove + Quigg LLP; Daniel P. Morris, Esq.

(57) ABSTRACT

An antireflective coating that contains at least two polymer components and comprises chromophore moieties and transparent moieties is provided. The antireflective coating is useful for providing a single-layer composite graded antireflective coating formed beneath a photoresist layer.

10 Claims, 7 Drawing Sheets

FIGURE 1. SUITABLE MONOMER UNITS OF POLYMER COMPONENTS FOR GRADED ANTIREFLECTIVE COATING COMPOSITIONS OF THE DISCLOSURE

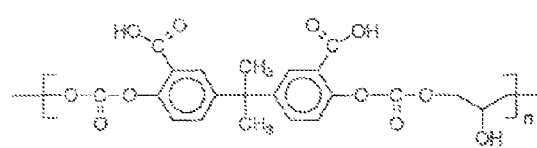
Fig. 1vv
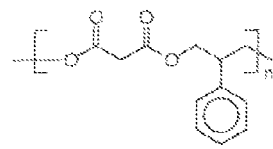
Fig. 1ww
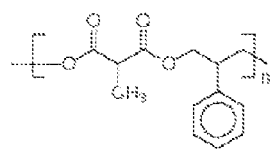
Fig. 1xx
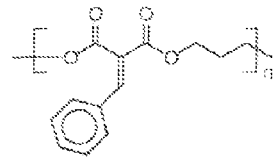
Fig. 1yy
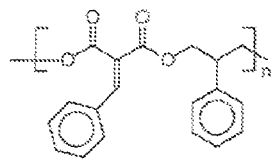
Fig. 1zz
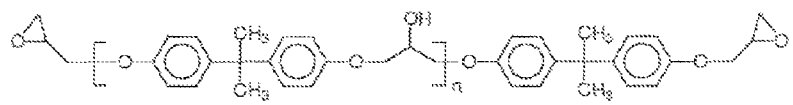
Fig. 1aaa

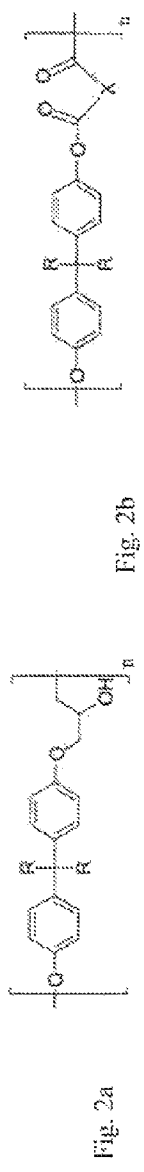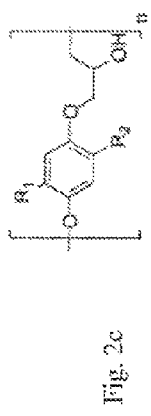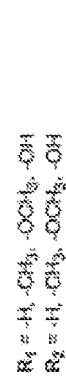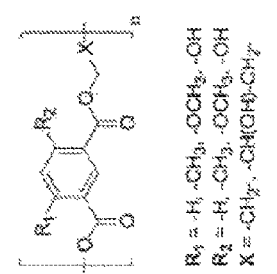
FIGURE 2. POLYMER STRUCTURES FOR ORGANIC GRADED SPIN-ON BARC COMPOSITIONS OF THE DISCLOSURE FIGURE 3. VALUES OF THE REFRACTIVE INDEX (n) AND EXTINCTION COEFFICIENT (k) AT 193nm OF POLYMER COMPONENTS OF THE DISCLOSURE

| Polymer | n193 | k193 |
|---|---|---|
| 20 (Fig. 1t) | 1.49 | 0.79 |
| 26 (Fig. 1z) | 1.44 | 0.68 |
| 28 (Fig. 1bb) | 1.58 | 0.66 |
| 29 (Fig. 1cc) | 1.56 | 0.59 |
| 30 (Fig. 1dd) | 1.43 | 0.45 |
| 31 (Fig. 1ee) | 1.30 | 0.46 |
| 32 (Fig. 1ff) | 1.46 | 0.53 |
| 33 (Fig. 1gg) | 1.48 | 0.46 |
| 34 (Fig. 1hh) | 1.35 | 0.52 |
| 36 (Fig. 1jj) | 1.58 | 0.51 |
| 37 (Fig. 1kk) | 1.58 | 0.35 |
| 41 (Fig. 1oo) | 1.49 | 0.78 |
| 43 (Fig. 1qq) | 1.43 | 0.55 |

ORGANIC GRADED SPIN ON BARC COMPOSITIONS FOR HIGH NA LITHOGRAPHY

TECHNICAL FIELD

The present disclosure relates to polymer compositions and their use in photolithography including deep ultraviolet photolithography and semiconductor fabrication. More specifically, a spin-castable multi-component organic antireflective coating (ARC) is disclosed wherein the materials composition is varied throughout the thickness of the ARC layer such that the complex refractive index of the graded ARC layer varies from the ARC-substrate interface to the ARC-photoresist interface. As a result, the radiation intensity that is reflected at the ARC-photoresist interface is substantially decreased, while the light that penetrates the ARC layer is absorbed, thus minimizing the radiation reflected from the underlying substrate. Photolithographic limitations such as substrate reflectivity, swing effect and reflective notching can be reduced, in particular when ultraviolet radiation penetrates the imaging layer at high angles of incidence.

BACKGROUND ART

The extension of 193 nm optical lithography to numerical aperture (NA) values above 1.0, enabled by immersion optical projection systems, provides a means of achieving increased resolution for a printable minimum feature size, and therefore allows for further scaling of integrated circuits (IC) by the semiconductor industry.

Current state-of-the-art techniques in optical projection printing (such as 193 nm immersion lithography at NA=1.2) can resolve features beyond 50 nm half-pitch in photoresists with good linewidth control when planar, low reflectivity substrates are used. However, when photoresists are exposed on reflective substrates in the presence of underlying surface topography, critical dimension (CD) control problems are exacerbated under high NA imaging conditions, and lead to the deterioration of the quality of the printed image.

Reflection of light from the substrate/resist interface produces variations in the light intensity and scattering in the resist during exposure, resulting in non-uniform photoresist linewidth upon development. Light can scatter from the interface into regions of the resist where exposure was not intended, resulting in linewidth variations. The amount of scattering and reflection will typically vary from region to region resulting in linewidth non-uniformity.

To eliminate the effects of chromatic aberration in exposure equipment lenses, monochromatic or quasi-monochromatic light is commonly used in resist projection techniques. Unfortunately, due to resist/substrate interface reflections, constructive and destructive interference is particularly significant when monochromatic or quasi-monochromatic light is used for photoresist exposure. In such cases the reflected light interferes with the incident light to form standing waves within the resist. In the case of highly reflective substrate regions, the problem is exacerbated since large amplitude standing waves create thin layers of underexposed resist at the wave minima. If the resist thickness is non-uniform, the problem becomes more severe, resulting in variable linewidth control.

More specifically related to high NA optical imaging, photolithographic systems that utilize high NA lenses cause light to diffract at high angles. This deviation from normal incidence causes increased reflectance at the resist-air and resist-substrate interfaces, thus exacerbating the problem. Increased reflectance in turn causes an increase in both standing waves and CD swing.

In addition to the challenges posed by the use of high NA optical systems described above, additional difficulties arise in this field due to the fundamental loss in image contrast that occurs for the transverse magnetic (TM or p-) polarization state at large oblique angles (T. Brunner et al., Proceedings of SPIE Vol. 4691, p. 1, 2002). This loss in TM image contrast at high angles adds up to other sources of image contrast degradation such as blocking of diffraction orders at the pupil edge, defocus effects, image flare effects, stage vibrations, etc.

Linewidth control problems due to non-uniform reflectance also arise from substrate topography. Any image on the wafer will cause impinging light to scatter or reflect in various uncontrolled directions (reflective notching), affecting the uniformity of resist development. As the topography becomes more complex with efforts to design more complex circuits, the effects of reflected light become much more critical (H. Yoshino et al., Journal of Vacuum Science and Technology B, Vol. 15, p. 2601, 1997).

As a result of the optical effects at high NA and reflective notching described above, extending the resolution capability of 193 nm lithography requires reflectivity control over a wider range of angles.

A common method to address problems related to reflectivity control within imaging layers, is to apply an antireflective coating (ARC). A top ARC (TARC) deposited over the photoresist layer can significantly reduce the swing effect by reducing the reflectivity at the air-photoresist interface, however a TARC does not reduce the notching problem. Instead, a bottom ARC (BARC) formed beneath the photoresist layer is capable of eliminating both the swing and notching problems, and has emerged as the most effective reflectivity solution while interfering the least with the lithographic process.

Two types of BARC layers are commonly used by the semiconductor industry. Spin-on BARCs are typically organic materials applied as a liquid formulation to the semiconductor substrate from a spin-coating station (track). After the BARC fibrils formed, a high temperature bake (post-apply bake) is used to remove the casting solvent and to crosslink the polymer components, so as to form a BARC layer that is impervious to the casting solvent used in the photoresist formulation that is coated subsequently. In this case, the optical properties are defined by the chemical functionality of the polymer components present in the formulation.

Alternatively, BARCs deposited through radiation assisted techniques such as chemical vapor deposition (CVD), high density plasma, sputtering, ion beam or electron beam are typically inorganic or hybrid materials (e.g. silicon nitrides, silicon oxynitrides, hydrogenated silicon carboxynitrides, or combinations thereof) that are applied from a gas phase in a stand-alone deposition chamber, utilizing precursors capable of being volatilized, combined with gaseous co-reactants and converted to their corresponding hybrid or inorganic derivatives at high temperatures or assisted by plasma conditions. In this case, the chemical nature of the precursors and the reactant concentration ratios define the net chemical composition and the optical properties of the deposited BARC layer.

In any case, as the NA exceeds 1.0, a homogeneous single layer bottom antireflective coating (BARC) may not suffice in keeping substrate reflectivity below 1% at all incident angles, as indicated by Abdallah et al. (Proceedings of SPIE, Vol. 5753, p. 417, 2005). Instead, strategically structuring BARCs has been reported as the preferred approach to ameliorate the detrimental side effects of high-NA imaging and reflective notching when practicing high resolution lithography (K. Babich et al., Proceedings of SPIE, Vol. 5039, p. 152, 2003). Such strategy includes the use of discrete or continuous bottom antireflective multilayers with optical properties defined throughout the antireflective element(s) in such a way that the optical constants at the top of the BARC surface are approximately or identically equal to those of the photoresist at the exposure wavelength, to minimize reflection at the photoresist-BARC interface. The bottom section of the BARC is highly absorbing at the exposure wavelength, to minimize reflection from the ARC-substrate interface back into the photoresist. This idea has been accomplished by the use of either a multilayer BARC or a continuously graded BARC.

In the case of a multilayer BARC, two or more antireflective layers with distinct and properly selected refractive index (n) and absorption coefficient (k) are consecutively applied on the semiconductor substrate, thus forming an antireflective stack with enhanced optical properties with respect to a single layer BARC. The simplest case for a multilayer BARC, namely a dual-layer BARC, has been previously described as being effective at reducing unwanted reflectivity in semiconductor substrates, by using combinations of all-organic (Abdallah et al., Proceedings of SPIE Vol. 5753, p. 417, 2005), organic-inorganic (Ghandehari et al., U.S. Pat. No. 6,867,063) or all-inorganic materials (Linliu et al., U.S. Pat. No. 6,479,401).

Continuously graded BARC films with n and k values that can be tuned and varied throughout the depth of the antireflective layer can be generated using plasma-enhanced chemical vapor deposition (PECVD) methods, where the reactant feed ratios are continuously changed during the CVD BARC deposition process. Such is the case for the deposition of graded silicon oxycarbide (U.S. Pat. No. 6,297,521), graded silicon oxynitride (U.S. Pat. No. 6,379,014) or graded hydrogenated silicon carboxynitride (U.S. Pat. No. 6,514,667) BARC layers. Alternatively, a chemically uniform CVD-deposited BARC layer can be optically graded by chemically modifying the top surface with a plasma treatment (Applied Optics, Vol. 43, p. 2141, 2004).

The advantageous optical properties of structured BARCs such as those composed of a multilayered or graded antireflective film are met at the inevitable expense of added complexity to the lithographic process. A simple spin-on dual-layer BARC requires the use of two separate formulations and coating steps, which can increase the number of defects introduced on the substrate before the photoresist layer is applied, and represents a reduction in wafer throughput. Analogously, a graded CVD BARC necessitates a separate deposition chamber, which adds to the cost of the manufacturing process, and also represents a throughput reduction with respect to an all-track processing, due to the need to transport the wafers from the track to the CVD tool and back ("How AR Coatings Stack Up", L. Peters; Semiconductor International, September 2005).

SUMMARY

The present disclosure provides an improved process for lithographic imaging, and especially at high NA, and in particular where highly reflective substrates are utilized, or when embedded topography is present in the semiconductor substrate.

The present disclosure comprises the formation and use of a single-layer spin-on graded BARC having strategically designed optical qualities. The optical properties qualities make possible the enhancement of the control of design features below 65 nm.

The antireflective coating compositions are characterized by the presence of two or more polymer components and by having chromophore moieties and transparent moieties. The polymer components within the antireflective coating composition individually segregate to the top (ARC-photoresist) or bottom (ARC-underlayer) interfaces, thus imparting graded optical properties to the antireflective layer. The present disclosure also encompasses methods of using the graded antireflective coating compositions of the disclosure to pattern underlying material layers on a substrate. The present disclosure also encompasses lithographic structures such as a patterned combination of resist layer and graded antireflective layer.

In one aspect, the present disclosure encompasses a composition suitable for formation of a spin-on graded antireflective layer, the composition comprising:
(a) two or more polymers wherein at least one of the polymers has at least one chromophore moiety and at least one of the polymers has at least one transparent moiety,
(b) a crosslinking component, and
(c) an acid generator.

At least two of the polymer components chemically differ from each other. The polymer components are typically random copolymers selected from the group of homopolymers or copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (optical constants, surface energy). The polymer components also typically contain a plurality of reactive sites distributed along the polymer for reaction with the crosslinking component. The acid generator is typically a thermally activated acid generator.

In another aspect, the present disclosure is directed to a method of forming a patterned material layer on a substrate, the method comprising: providing a substrate having a material layer on a surface thereof; forming a graded antireflective coating layer wherein the graded antireflective coating comprises a plurality of polymer components that chemically differ from each other and wherein said plurality of polymer components contain at least one moiety being a chromophore to preselected imaging radiation wavelength and at least one moiety transparent to said preselected imaging radiation wavelength, over the material layer, depositing a photoresist composition on the substrate to form a photoresist imaging layer on the material; optionally applying a topcoat layer; patternwise exposing the imaging layer to radiation thereby creating a pattern of radiation-exposed regions in the imaging layer, selectively removing portions of the imaging layer and the antireflective layer to expose portions of the material layer, and etching the exposed portions of the material layer, thereby forming the patterned material feature.

The material to be patterned is typically a conductive, semiconductive, magnetic or insulative material, more typically a metal. These and other aspects of the invention are discussed in further detail below.

Another aspect of the present disclosure relates to a structure comprising: a single-layer graded antireflective coating wherein the single-layer graded antireflective coating comprises a plurality of polymer components that chemically differ from each other and wherein the plurality of polymer components contain at least one moiety being a chromophore to preselected imaging radiation wavelength and at least one moiety transparent to the preselected imaging radiation wavelength, located beneath a photoresist layer;

the photoresist;

there being a second interface between the single-layer composite graded antireflective coating and substrate;

the single-layer composite graded antireflective coating comprises optical properties providing substantial control of features sizes below 65 nm; the plurality of polymer components within the single-layer composite graded antireflective coating substantially segregate between the first interface and second interface.

Still other objects and advantages of the present disclosure will become readily apparent by those skilled in the art from the following detailed description, wherein it is shown and described only in the preferred embodiments, simply by way of illustration of the best mode. As will be realized, the disclosure is capable of other and different embodiments, and its several details are capable of modifications in various obvious respects, without departing from the disclosure. Accordingly, the description is to be regarded as illustrative in nature and not as restrictive.

BRIEF DESCRIPTION OF THE DRAWINGS

The present disclosure may be better understood, and its numerous objects, features, and advantages made apparent to those skilled in the art by referencing the accompanying drawings.

FIG. 2 shows examples of structures of polymer components for graded antireflective coating compositions of the disclosure.

FIG. 3 shows values of the refractive index (n) and extinction coefficient (k) at 193 nm of polymer components suitable for graded antireflective coating compositions of the disclosure.

DESCRIPTION OF BEST AND VARIOUS MODES FOR CARRYING OUT THE DISCLOSURE

Figure 1A:
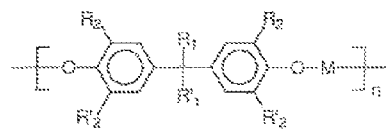
FIG. 1 shows structures that are suitable monomer units of polymer components for graded antireflective coating compositions of the disclosure.

The present disclosure encompasses novel antireflective coating compositions which are useful in lithographic processes. In carrying out the present disclosure, conventional materials and processing techniques can be employed and, hence, such conventional aspects are not set forth herein in detail. For example, etching of the underlying dielectric layer is conducted in a conventional manner. One having ordinary skill in the art once aware of the present disclosure could select suitable photoresist materials and etchants, and employ suitable deposition and etching techniques without undue experimentation.

In the present disclosure, surface energy differences between optically contrasting polymer components of a spin-on BARC composition are used as a driving force for the preferential segregation of such components towards the ARC-air and ARC-substrate interfaces, so as to create an optically graded film. This effect can be enhanced in particular cases where the optically contrasting polymers have limited mutual miscibility or are highly immiscible.

The graded BARC prepared in such manner has enhanced antireflective properties compared to a non-graded single layer BARC as discussed herein above. In addition, the present disclosure enables a faster and more economical processing of the graded BARC, compared to other structured BARCs, such as multilayer or graded CVD BARCs, since it can be coated in one step without the need of using a CVD tool. However, if desired additional antireflective coatings could be used in conjunction with the graded BARC compositions disclosed herein such as being coated above these graded BARC compositions.

The polymers that are employed in the graded BARC formulation are selected in such a way that preferential segregation of one or more components towards the physical interfaces (ARC-air and ARC-substrate) occurs during the film casting and/or film baking process. In polymer blends, differences in interfacial energies, which reflect a preferential interaction, generally cause one polymer to segregate to the substrate or air interface. For polymer blend constituents having different hydrophobicity or surface tension, the more hydrophobic or lower surface tension species will typically wet the blend film surface during the coating or baking process. Even slight differences in atomic polarizability between polymer chains, such as in the case of hydrogenated polystyrene/deuterated polystyrene (H vs D), can induce a surface energy mismatch and lead to preferential wetting of the blend/air interface (R. A. L. Jones et al. Phys. Rev. Lett. 62, 1989, p. 280). Preferential wetting of the blend/substrate interface by one of the blend constituents may also occur, based on analog interfacial energy arguments (D. A. Winesett et al., Polym. Internat. 49, 2000, p. 458). Conversely, hydrogen-bonding interactions between polymer components can reduce the extent of interfacial segregation (Y. Duan et al., Macromol. 34, 2001, p. 6761).

The antireflective coating compositions of the present disclosure are characterized by the presence of more than one polymer component. Those components do not necessarily need to remain thermodynamically miscible during the coating and film forming process for the antireflective coating to self-assemble into a vertically graded layer. Polymer phase separation that occurs perpendicularly to the substrate plane combined with preferential substrate wetting by one component can lead to chemically and optically graded films that are absent of detectable surface defects. Therefore, graded BARC films formed by spin-coating using standard processing techniques and tools known to those skilled in the art render nanoscopically smooth films, suitable for high resolution lithography patterning.

On the contrary, when lateral phase separation is verified, as in the case of partially miscible polymers coated on a neutral surface, defects under the form of islands, craters, protrusions, roughness, comets, marks, satellite spots, etc. are verified during the simultaneous polymer demixing and coating process, rendering films with no practical use in the field of lithographic patterning for semiconductor manufacturing.

At least one of the polymer components present in the graded antireflective coating compositions of the present disclosure is characterized by having at least one chromophore moiety and at least one of the polymer components has at least one transparent moiety. Having these different moieties imparts the differential optical properties required for the formation of an optically graded layer. In certain aspects of this disclosure, at least two of the polymer components have both at least one chromophore moiety and at least one transparent moiety. In certain aspects of this disclosure, each of the polymer materials displays interfacial segregation properties and differential optical properties simultaneously. Antireflective coating films according to this disclosure are optically graded, in a sense that the real (n) and imaginary (k) part of the complex refractive index varies, which can be substantially continuous, throughout the depth of the film as a result of the interfacial segregation of the polymer components of the film. A typical combination of polymer components with differential optical properties is one where the polymer segregating to the bottom surface of the ARC (substrate-ARC interface) has higher k with respect to the polymer segregating to the top surface of the ARC (ARC-air interface). Typically the polymer component that exhibits the higher relative transparency has a k value of about 0 to about 0.5, and the one that exhibits the higher relative absorbance has a k value of about 0.25 to about 1 with the one that exhibits the higher relative absorbance having the higher of the k values. When employing two polymers, they are typically employed in ratios about 10:90 to about 90:10; more typically about 30:70 to about 70:30; even more typically about 60:40 to about 40:60, a particular example being about 50:50.

The disclosure also encompasses methods of using the antireflective coating compositions disclosed herein to pattern underlying material layers on a substrate. The disclosure also encompasses lithographic structures such as a patterned combination of resist layer and antireflective coating layer.

The antireflective coating compositions of the disclosure generally comprise:
   a blend of two or more polymer components that chemically differ from each other, wherein said polymer components are selected from the group consisting of homopolymers or copolymers selected from the group consisting of polybisphenols, polysulfones, polycarbonates, polyhydroquinones, polyphthalates, polybenzoates, polyphenylethers, polyhydroquinone alkylates, polycarbamates and polymalonates; and wherein said plurality of polymer components contain at least one moiety being a chromophore to preselected imaging radiation wavelength and at least one moiety transparent to said preselected imaging radiation wavelength,
   a crosslinking component, and
   an acid generator.

The polymer blend typically has solution and film-forming characteristics conducive to forming a layer by conventional spin-coating.

Figure 1B:
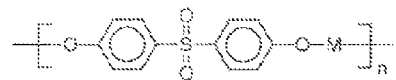
Figure 1C:
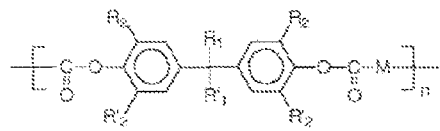
Figure 1D:
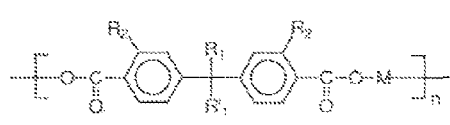
Figure 1E:
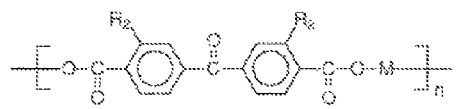
Figure 1F:
Figure 1G:
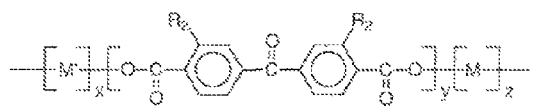
Figure 1H:
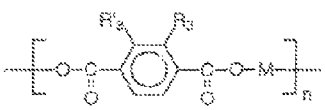
Figure 1I:
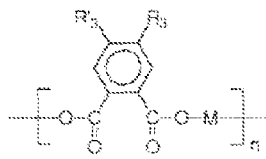
Figure 1J:
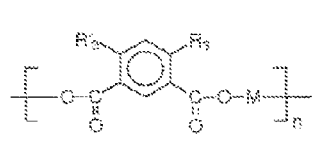
Figure 1K:
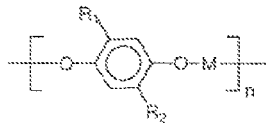
Figure 1L:
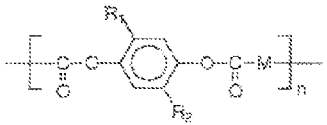
Figure 1M:
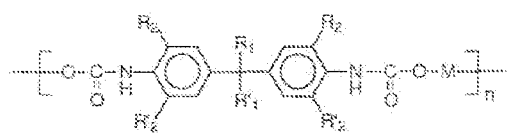
Figure 1N:
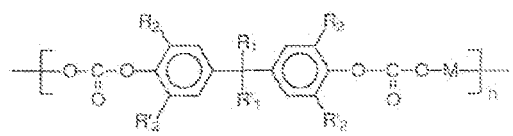
Figure 1O:
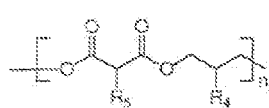
Figure 1P:
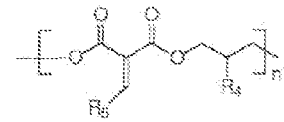
Figure 1Q:
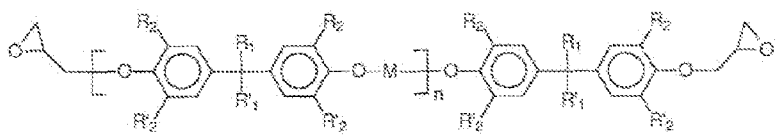
Figure 1R:
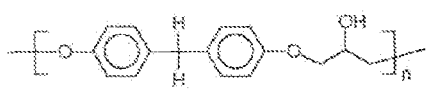
Figure 1S:
Figure 1T:
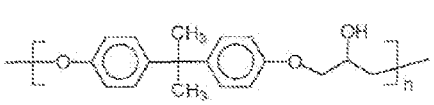
Figure 1U:
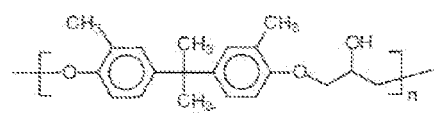
Figure 1V:
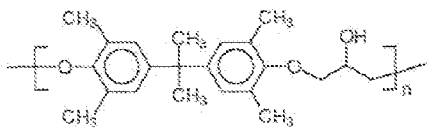
Figure 1W:
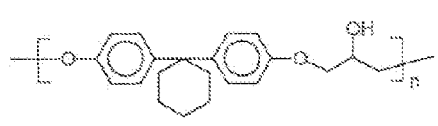
Figure 1X:
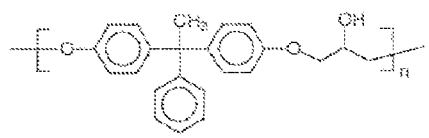
Figure 1Y:
Figure 1Z:
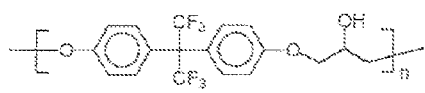
Figure 1A:
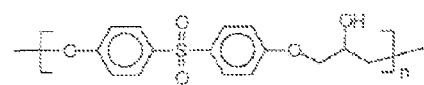
Figure 1B:
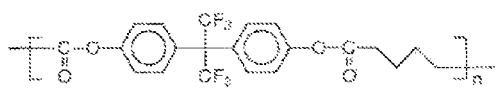
Figure 1C:
Figure 1D:
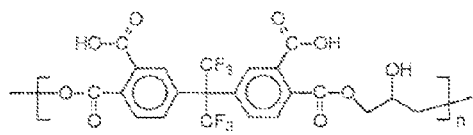
Figure 1E:
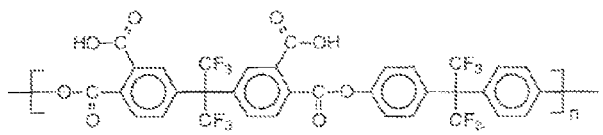
Figure 1F:
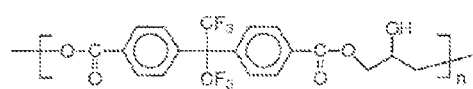
Figure 1G:
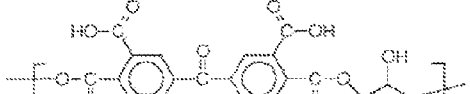
Figure 1H:
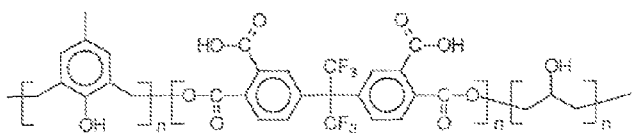
Figure 1I:
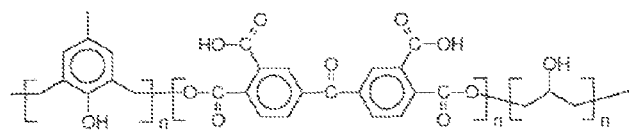
Figure 1J:
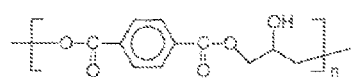
Figure 1K:
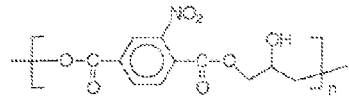
Figure 1L:
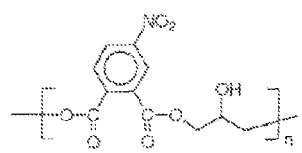
Figure 1M:
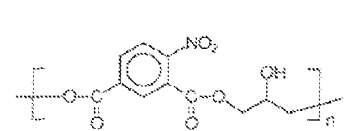
Figure 1N:
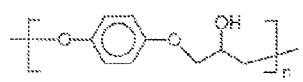
Figure 1O:
Figure 1P:
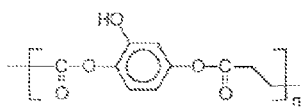
Figure 1Q:
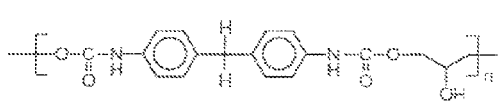
Figure 1R:
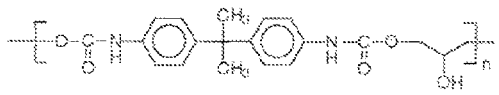
Figure 1S:
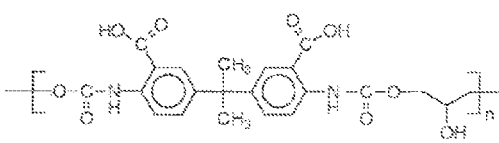
Figure 1T:
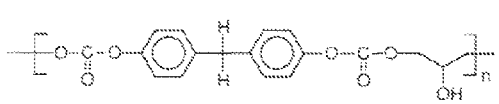
Figure 1U:
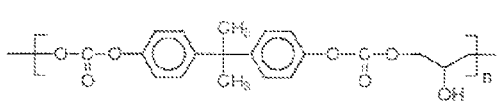

The polymer components that comprise the antireflective coating composition typically contain one or more monomers having one of the following structures shown in FIG. 1, where R1, R1' can be comprised of hydrogen, alkyl, cycloalkyl, fluoroalkyl, hydroxyalkyl, hydroxyfluoroalkyl and phenyl entities; R2, R2' can be selected from a group consisted of hydrogen, alkyl, fluoroalkyl, carboxyl and hydroxyl; R3, R3' can be carbonyl-, carboxy-, alkyl-, alkoxy or nitro group; R4 is a hydrogen, hydroxyl, alkoxy, alkyl or phenyl group; R5 is a hydrogen, alkyl or aryl group; and M, M' are hydroxyalkyl, alkyl, fluoroalkyl group, benzyl or hydroxybenzl groups. The alkyl groups typically contain 1-8 carbon atoms and more typically 1-4 carbon atoms. The cycloalkyl groups typically contain 3-7 carbon atoms.

Functionalization of the above monomers can be performed to selectively incorporate the required optical and mechanical properties into the polymer components, as well as to impart reactivity and solubility during formulation and processing of the antireflective coating composition. From a functional standpoint, polymeric structures carrying the properties mentioned above can be represented by the following structure:

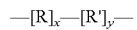

Wherein R comprises a chromophore or a transparent moiety which also defines the limiting etch rate of the polymeric material, while R' comprises a group that is a reactive site for reaction with the crosslinking component and enhances the interfacial segregation properties of the polymer with respect to the other polymer components of the antireflective film.

The chromophore-containing units or transparent moieties R may contain any suitable functional group which (i) can be grafted onto or incorporated into the polymer backbone (ii) has suitable radiation absorption characteristics, and (iii) does not adversely affect the performance of the layer or any overlying photoresist layers. For 193 nm radiation, typical chromophore moieties include, but are not limited to, phenyl, naphtalene and anthracene derivatives. Non-aromatic compounds containing unsaturated carbon bonds (e.g., carbon-carbon double bonds) are also suitable chromophores.

In the case of 193 nm imaging radiation, the transparent moieties are typically bulky (C2 or higher) organic moieties substantially free of unsaturated carbon-carbon bonds. More typical transparent moieties for 193 nm applications are adamantane, norbornane, isobornane, camphene, pinane and hexahydroindane derivatives.

R' comprises a reactive site for reaction with the crosslinking component. Typical reactive moieties contained in $R_2$ are alcohols, more typically aromatic alcohols (e.g., hydroxyphenyl, hydroxymethylphenyl, etc.), aliphatic alcohols (e.g. glyceryl) or cycloaliphatic alcohols (e.g., cyclohexanoyl). Alternatively, non-cyclic alcohols such as fluorocarbon alcohols, aliphatic alcohols, amino groups, vinyl ethers, and epoxides may, be used. These aforementioned groups can also impart enhanced solubility in a preferred casting solvent (vide infra) and/or tune the interfacial energy of the polymer by increasing or decreasing the hydrophobic nature of the polymer with respect to the other polymer components of the antireflective film. Contact angle measurements of water droplets deposited on the surface of a spin-on film cast from the individual polymer components of a graded BARC material can be used as a criterion to identify suitable polymers for graded BARC applications and anticipate their interfacial segregation properties. Typically, the polymer component with the highest contact angle value has a tendency to segregate to the free surface of the film.

The amount of chromophore units contained in $R_1$ groups is preferably balanced with the amount of groups that facilitate cross-linking ($R_2$) to provide a desired combination of energy absorption, antireflection and interfacial segregation. Persons skilled in the art, once aware of this disclosure, could select these amounts without undue experimentation depending upon their desired combination of properties. Eventually, chemical functionalities described for groups $R_2$ can also carry and impart the properties required for group $R_1$, and vice versa. Therefore, alternating copolymers that conform to the properties of $R_1$ and $R_2$ can be used as radiation-absorbing materials that fit the description for a graded BARC given above.

Examples of polymer components suitable for graded BARC applications are shown in FIG. 1, which include:
   Poly[4,4'-methylene bisphenol]-co-epichlorohydrin [18], poly[4,4'-ethylidene bisphenol]-co-epichlorohydrin [19], poly[4,4'-isopropylidene bisphenol]-co-epichlorohydrin [20], Poly[4,4'-isopropylidenebis(2-methylphenol)]-co-epichlorohydrin [21], Poly[4,4'-isopropylidenebis(2,6-dimethylphenol)]-co-epichlorohydrin [22], Poly[4,4'-cyclohexylidene bisphenol]-co-epichlorohydrin [23], Poly[4,4'-(1-Phenylethylidene)bisphenol]-co-epichlorohydrin [24], Poly[4,4'-(trifluoroisopropylidene)bisphenol]-co-epichlorohydrin [25], Poly[4,4'-(hexafluoroisopropylidene) bisphenol]-co-epichlorohydrin [26], Poly[4,4'-sulfonyl bisphenol]-co-epichlorohydrin [27], poly(bisphenol AF adipic ester] [28], poly(bisphenol AF succinic ester][29], poly[4,4'-

(hexafluoroisopropylidene)diphthalate-co-epichlorohydrin [30], poly[4,4-(hexafluoroisopropylidene)diphthalate-co-poly(bisphenol AF) [31], poly[4,4'-(hexafluoroisopropylidene)bis(benzoate)-co-epichlorohydrin] [32], poly[3,3',4,4'-benzophenonetetracarboxylate-co-epichlorohydrin][33], poly[4,4'-(hexafluoroisopropylidene)diphthalate-co-epichlorohydrin-co-2,6-bis(hydroxymethyl-p-cresol [34], poly[3,3',4,4'-benzophenonetetracarboxylate-co-epichlorohydrin-co-2,6-bis(hydroxymethyl-p-cresol] [35], poly(terephthalate-co-epichlorohydrin) [36], poly(2-nitroterephthalate-co-epichlorohydrin) [37], poly(2-nitrophthalate-co-epichlorohydrin) [38], poly(2-nitroisophthalate-co-epichlorohydrin) [39], poly(hydroquinone-co-epichlorohydrin) [40], poly(methylhydroquinone-co-epichlorohydrin) [41], poly(1,2,4-benzenetriol-co-epichlorohydrin) [42], poly(methylene-bis(4-aminophenyl)-co-glycerol carbamate) [43], poly(isopropylidene-bis(4-aminophenyl)-co-glycerol carbamate) [44], poly(isopropylidene-bis(3-carboxy-4-aminophenyl)-co-glycerol carbamate) [45], poly(methylene-bis(4-hydroxyphenyl)-co-glycerol carbonate) [46], poly(isopropylidene-bis(4-hydroxyphenyl)-co-glycerol carbonate) [47], poly(isopropylidene-bis(3-carboxy-4-hydroxyphenyl]-co-glycerol carbonate) [48], poly(2-phenyl-1,3-propanediol malonate) [49], poly(2-phenyl-1,3-propanediol 2-methylmalonate) [50], poly(1,3-propanediol benzylidene-malonate) [51], poly(2-phenyl-1,3-propanediol benzylidene-malonate) [52], poly(bisphenol A-co-epichlorohydrin), glycidyl end-capped [53].

The polymers of the disclosure typically have a weight average molecular weight, before reaction with the crosslinking component, of at least about 1000, more typically up to about 500,000 and even more typically a weight average molecular weight of about 1000-10,000. In certain aspects of this disclosure, the polymer components typically have a refractive index (n) in the range of about 1.3 to about 2.0 and more typically in the range of about 1.3 to about 1.8, at a pre-selected imaging radiation wavelength. Also, in certain aspects of this disclosure, the polymer components typically have an extinction coefficient (k) in the range of about 0.001 to about 1.1, at a pre-selected imaging radiation wavelength.

The crosslinking component is typically a crosslinker that can be reacted with all the polymer components present in the antireflective coating composition in a manner which is catalyzed by generated acid and/or by heating. Generally, the crosslinking component used in the antireflective coating compositions of the invention may be any suitable crosslinking agent known in the negative photoresist art which is otherwise, compatible with the other selected components of the composition. The crosslinking agents typically act to crosslink the polymer component in the presence of a generated acid. Typical crosslinking agents are glycoluril compounds such as tetramethoxymethyl glycoluril, methylpropyltetramethoxymethyl glycoluril, and methylphenyltetramethoxymethyl glycoluril, available under the POWDERLINK trademark from Cytec Industries. Other possible crosslinking agents include: 2,6-bis(hydroxymethyl)-p-cresol compounds such as those disclosed in Japanese Laid-Open Patent Application (Kokai) No. 1-293339, etherified amino resins, for example methylated or butylated melamine resins (N-methoxymethyl- or N-butoxymethylmelamine respectively), and methylated/butylated glycolurils, for example as disclosed in Canadian Patent No. 1 204 547. Other crosslinking agents such as bis-epoxies or bis-phenols (e.g., bisphenol-A) may also be used. Combinations of crosslinking agents may be used.

The acid generator is typically a thermal acid generator compound that liberates acid upon thermal treatment. A variety of known thermal acid generators are suitably employed such as e.g. 2,4,4,6-tetrabromocyclohexadienone, benzoin tosylate, 2-nitrophenyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the antireflective composition. Where a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process (e.g., for wafers in a production line). Mixtures of acid generators may be used.

The antireflective coating compositions of the present disclosure will typically contain a solvent prior to their application to the desired substrate. The solvent may be any solvent conventionally used with resists which otherwise does not have any excessively adverse impact on the performance of the antireflective composition. Typical solvents are propylene glycol monomethyl ether acetate, cyclohexanone, and ethyl lactate. The amount of solvent in the composition for application to a substrate is typically sufficient to achieve a solids content of about 2-20 wt. %. Higher-solids content formulations will generally yield thicker coating layers. The compositions of the present disclosure may further contain minor amounts of auxiliary components (e.g., base additives, etc.) as may be known in the art.

The antireflective coating compositions of the present disclosure can be prepared by combining the polymer, crosslinking component and acid generator, and any other desired ingredients using conventional methods. The compositions of the present disclosure advantageously may be formed into antireflective coating layers on a substrate by spin-coating followed by baking to achieve crosslinking and solvent removal. The baking is typically conducted at about 250° C. or less, more preferably about 150° C.-220° C. The baking time may be varied depending on the layer thickness and bake temperature.

The thickness of the antireflective coating composition of the present disclosure may be varied depending on the desired function. For typical applications, the thickness of the composition is typically about 100-10000 Å, more typically about 200-2000 Å. The compositions of the invention can have etch resistant properties that are lower, equal or higher than those photoresist materials that are conventionally used in 193 nm photolithography and whose etch properties are known to those skilled in the art.

The antireflective coating compositions of the present disclosure are especially useful for lithographic processes used in the manufacture of integrated circuits on semiconductor substrates. The compositions are especially useful for lithographic processes using deep-UV radiation such as 193 nm light.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. The composition of the present disclosure is typically applied directly over the material layer to be patterned, typically by spin-coating. The composition is then baked to remove solvent and cure (crosslink) the composition. A radiation-sensitive resist layer can then be applied (directly or indirectly) over the cured antireflective composition.

Typically, the solvent-containing resist composition is applied using spin coating or other technique. The substrate with the resist coating is then typically heated (pre-exposure baked) to remove the solvent and improve the coherence of the resist layer. The thickness of the applied layer is typically as thin as possible with the provisos that the thickness is typically substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to 2 minutes. The pre-exposure bake temperature may vary depending on the glass transition temperature of the photoresist.

After solvent removal, the resist layer is then patternwise-exposed to the desired radiation (e.g. 193 nm ultraviolet radiation). Typically, with wave-like radiation such as 193 nm ultraviolet radiation, the patternwise exposure is conducted through a mask which is placed over the resist layer. For 193 nm UV radiation, the total exposure energy is typically about 100 $mJ/cm^2$ or less, more typically about 50 $mJ/cm^2$ or less (e.g. 15-30 $mJ/cm^2$).

After the desired patternwise exposure, the resist layer is typically baked to further complete the acid-catalyzed reaction and to enhance the contrast of the exposed pattern. The post-exposure bake is typically conducted at about 60° C.-175° C., more preferably about 90° C.-160° C. The post-exposure bake is typically conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Typical alkaline solutions (developers) are aqueous solutions of tetramethyl ammonium hydroxide. The resulting lithographic structure on the substrate is then typically dried to remove any remaining developer solvent.

The pattern from the resist structure may then be transferred to the exposed portions of the layer of antireflective material of the present disclosure by etching with $CF_4$ or other suitable etchant using techniques known in the art.

After the opening of the layer of antireflective coating layer of the present disclosure, the underlying material layer to be patterned may then be etched using an etchant appropriate to the material layer composition. Where the material layer is a metal (e.g., Cr) a combination of $Cl_2/O_2$ may be used as a dry etchant.

Once the desired pattern transfer has taken place, any remaining resist may be removed using conventional stripping techniques.

Thus, the compositions of the present disclosure and resulting lithographic structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices. The compositions are especially useful in the context of creating patterned layers of oxides, nitrides or polysilicon.

Examples of general lithographic processes where the composition of the present disclosure may be useful are disclosed in U.S. Pat. Nos. 4,855,017; 5,362,663; 5,429,710; 5,562,801; 5,618,751; 5,744,376; 5,801,094; 5,821,469 and 5,948,570. Other examples of pattern transfer processes are described in Chapters 12 and 13 of "Semiconductor Lithography, Principles, Practices, and Materials" by Wayne Moreau, Plenum Press, (1988). It should be understood that the invention is not limited to any specific lithographic technique or device structure.

The present disclosure is particularly effective in reducing the monochromatic radiation reflected from buried interfaces into the photoresist imaging layer to intensity levels that do not cause any detrimental effect on the accuracy with which photoresist structures are defined. In the case where the semiconductor substrate comprises a substantially transparent substrate containing various topographical features, such as topographical features at different depths within the substrate, the present: disclosure tends to ameliorate the reflective notching problem.

Compositions of the present disclosure are capable of providing outstanding optical, mechanical and etch selectivity properties while being applicable for use in spin-on application techniques as discussed above.

The following non-limiting examples are provided to further illustrate the present invention. Because the examples are provided for illustrative purposes only, the invention embodied therein should not be limited thereto.

EXAMPLES

Example 1

Materials Synthesis (Polymer 43)—A round bottom flask was charged with pyridine (5 mL) and glycerol (5.1 mmol, 470 mg). 4,4'-Methylene-bis(phenyl isocyanate) (5 mmol. 1.25 g) was added and the reaction mixture was stirred for 20 hours at ambient temperature. Then it was poured into 100 mL of 1M HCl, the solids were filtered off and vacuum dried. The material was further purified by dissolving in DMF and pouring into vigorously stirred water. After filtration and vacuum drying, 800 mg of polymer 43 was obtained.

Example 2

Optical and Physical Properties—The optical constants (the index of refraction n and the extinction coefficient k) of individual components suitable for graded BARC applications are measured at a radiation wavelength of 193 nm using a Variable Angle Spectroscopic Ellipsometer (VASE) manufactured by J.A. Woollam, Inc. The optical properties of individual polymer components are shown in FIG. 3.

Example 3

Formulation—Polymer components are dissolved in propylene glycol monomethyl ether acetate (PGMEA) in individual concentrations of 50 parts by weight each (1.8% by weight each with respect to the solvent). One polymer component has an extinction coefficient k higher than 0.5. Another polymer component has an extinction coefficient k lower than 0.5. A crosslinking agent tetramethoxymethyl glycoluril, available from DayChem, in a concentration of 10 parts by weight and di(t-butylphenyl)iodonium perfluorobutylsulfonate (DtBPI-PFBuS) in a concentration of 5 parts by weight are added to the solution, achieving 4.2 wt. % by weight of total solids.

Example 4

Film Formation—Formulations, prepared as described in Example 3, are spin coated onto a 300 mm silicon wafer at 1500 rpm for 60 sec. The film thickness is about 750 Å. The spin cast film is cured in two steps. The first bake step is carried at 130° C. for 60 see, after which the wafers are allowed to cool down to room temperature on a chill plate. The second bake step is carried at 220° C. for 120 sec., after which the wafers are allowed to cool down to room temperature on a chill plate again.

The term "comprising" (and its grammatical variations) as used herein is used in the inclusive sense of "having" or "including" and not in the exclusive sense of "consisting only of". The terms "a" and "the" as used herein are understood to encompass the plural as well as the singular.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The embodiments described hereinabove are further intended to explain best modes known of practicing the invention and to enable others skilled in the art to utilize the disclosure in such, or other, embodiments and with the various modifications required by the particular applications or uses disclosed herein. Accordingly, the description is not intended to limit the invention to the form disclosed herein. Also, it is intended that the appended claims be construed to include alternative embodiments.

All publications, patents and patent applications cited in this specification are herein incorporated by reference, and for any and all purposes, as if each individual publication, patent or patent application were specifically and individually indicates to be incorporated by reference. In the case of inconsistencies, the present disclosure will prevail.

What is claimed:

1. A method of forming a patterned material layer on a substrate for an integrated circuit device, wherein said patterned material layer is selected from the group consisting of metal wiring lines, holes for contacts or vias, insulation sections, and trenches for capacitor structures, the method comprising:
   (a) providing a substrate having a surface;
   (b) depositing an antireflective coating layer comprising an antireflective coating composition on the substrate surface by spin coating, upon which an uniaxial optical gradient is formed within said antireflective coating layer in a direction orthogonal to the substrate surface;
   (c) depositing a photoresist composition on the antireflective coating layer to form a photoresist layer;
   (d) optionally applying a topcoat layer;
   (e) pattern-wise exposing the coated substrate to an imaging radiation;
   (f) contacting the coated substrate with a developer for removing a portion of the photoresist layer, and, if present, for removing the topcoat layer, to thereby form a patterned photoresist layer
   wherein the antireflective coating composition comprises:
   (a) a plurality of polymer components that chemically differ from each other, wherein at least one polymer component is selected from the group consisting of a polybisphenol, a polysulfone, a polycarbonate, a polyhydroquinone, a polyphthalate, a polybenzoate, a polyphenylether, a polyhydroquinone alkylate, a polycarbamate and a polymalonate and mixtures thereof and wherein said plurality of polymer components contain at least one moiety being a chromophore to a preselected imaging radiation wavelength and at least one moiety transparent to the preselected imaging radiation wavelength,
   (b) a separate crosslinking component, and
   (c) an acid generator,
   wherein the plurality of polymer components comprises two components which substantially segregate between a first interface, the first interface being between the antireflective coating layer and the substrate, and a second interface, the second interface being between the antireflective coating layer and the photoresist layer;
   wherein said polymer components are random copolymers;
   and
   wherein said polymer components comprise a plurality of reactive sites distributed along said polymer for reaction with said crosslinking component.

2. The method of claim 1, wherein said acid generator is a thermally activated acid generator.

3. The method of claim 1, wherein the plurality of polymer components have an extinction coefficient (k) in the range of about 0.001 to about 1.1, at the preselected imaging radiation wavelength.

4. The method of claim 1, wherein at least one polymer component is highly absorbing at the preselected imaging radiation wavelength.

5. The method of claim 1, wherein the plurality of polymer components have a tunable molecular weight ranging from about 1000 to about 500,000.

6. The method of claim 1, wherein said acid generator is a thermally activated acid generator,
   wherein said crosslinking component comprises a glycoluril compound,
   wherein the polymer components have a refractive index (n) in the range of about 1.3 to about 2.0, at the imaging radiation wavelength,
   wherein the polymer components have an extinction coefficient (k) in the range of about 0.001 to about 1.1, at the imaging radiation wavelength,
   wherein at least one polymer component is highly absorbing at the imaging radiation wavelength and
   wherein the polymer components have a tunable molecular weight ranging from about 1,000 to about 500,000.

7. The method of claim 1, wherein forming the antireflective coating and photoresist layers includes approximately matching the index of refraction (n) of the antireflective coating and photoresist layers at the interface between both said layers;
   wherein the extinction coefficient (k) of the uniaxially graded antireflective coating continuously increases in a direction away from the interface between the antireflective coating and photoresist layers;
   wherein the antireflective coating layer has a uniform thickness of about 200 to about 2000 Angstroms on the substrate;
   wherein the substrate is selected from the group consisting of ceramic, dielectric, metal and semiconductor layer;

wherein the pattern in the photoresist layer is transferred to the substrate by removing portions of the substrate not covered by the patterned photoresist layer;

wherein portions of substrate are removed by etching the material layer in areas not covered by the patterned photoresist layer; and wherein portions of the substrate are removed by using reactive ion etching.

8. The method of claim 1, wherein said crosslinking component comprises a glycoluril compound.

9. The method of claim 1, wherein the plurality of polymer components have a refractive index (n) in the range of about 1.3 to about 2.0 at the preselected imaging radiation wavelength.

10. A method for forming a patterned material layer for an integrated circuit device, wherein said patterned material layer is selected from the group consisting of metal wiring lines, holes for contacts or vias, insulation sections, and trenches for capacitor structures, comprising:

spin-coating a plurality of polymer components that chemically differ from each other, a crosslinking component, and an acid generator onto a substrate to form a single-layer graded antireflective coating, wherein the plurality of polymer components contain at least one moiety being a chromophore to a preselected imaging radiation wavelength and at least one moiety transparent to the preselected imaging radiation wavelength, disposing a photoresist layer on the single-layer graded antireflective coating;

there being a first interface between the single-layer graded antireflective coating and the photoresist;

there being a second interface between the single-layer graded antireflective coating and the substrate;

wherein the plurality of polymer components comprises two components which substantially segregate between the first interface and the second interface;

patterning the single-layer composite graded antireflective coating and the photoresist;

wherein the plurality of polymer components are random copolymers comprising moieties selected from the group consisting of polybisphenols, polysulfide's, polycarbonates, polyhydroquinones, polyphthalates, polybenzoates, polyphenylethers, polyhydroquinone alkylates, polycarbamates and polymalonates; and wherein the plurality of polymer components comprise a plurality of reactive sites distributed along the plurality of polymer components for reaction with the crosslinking component.

* * * * *